United States Patent
Li et al.

(10) Patent No.: US 10,224,385 B2
(45) Date of Patent: Mar. 5, 2019

(54) DISPLAY PANEL AND ELECTRONIC DEVICE

(71) Applicants: Shanghai Tianma AM-OLED Co., Ltd, Shanghai (CN); Tianma Micro-electronics Co., Ltd., Shenzhen (CN)

(72) Inventors: Chunyang Li, Shanghai (CN); Dong Qian, Shanghai (CN)

(73) Assignee: Shanghai Tianma AM-OLED Co., Ltd, Shanghai (CN)

( * ) Notice: Subject to any disclaimer, the term of this patent is extended or adjusted under 35 U.S.C. 154(b) by 54 days.

(21) Appl. No.: 15/219,176

(22) Filed: Jul. 25, 2016

(65) Prior Publication Data
US 2017/0317157 A1    Nov. 2, 2017

(30) Foreign Application Priority Data
Apr. 29, 2016   (CN) .......................... 2016-10279045

(51) Int. Cl.
| | |
|---|---|
| *G02F 1/1362* | (2006.01) |
| *H01L 27/32* | (2006.01) |
| *G02F 1/1339* | (2006.01) |
| *G06F 1/16* | (2006.01) |
| *H01L 51/00* | (2006.01) |

(Continued)

(52) U.S. Cl.
CPC ........ *H01L 27/3276* (2013.01); *G02F 1/1339* (2013.01); *G02F 1/136286* (2013.01); *G06F 1/163* (2013.01); *G06F 1/1637* (2013.01); *H01L 51/0096* (2013.01); *H01L 51/5243* (2013.01); *H01L 51/5246* (2013.01); *G02F 1/1368* (2013.01); *G02F 2001/133311* (2013.01); *G02F 2001/136295* (2013.01);

(Continued)

(58) Field of Classification Search
CPC .................................................. H01L 27/3276
See application file for complete search history.

(56) References Cited

U.S. PATENT DOCUMENTS

| | | | |
|---|---|---|---|
| 5,717,476 A | 2/1998 | Kanezawa et al. | |
| 2004/0207314 A1* | 10/2004 | Aitken | C03C 3/072 313/504 |

(Continued)

FOREIGN PATENT DOCUMENTS

| | | |
|---|---|---|
| CN | 101009275 A | 8/2007 |
| CN | 101009301 A | 8/2007 |

(Continued)

*Primary Examiner* — Sang V Nguyen
(74) *Attorney, Agent, or Firm* — Anova Law Group, PLLC

(57) ABSTRACT

A display panel and an electronic device are provided. The display panel comprises a base substrate including a display region and a border region surrounding the display region, wherein the border region includes an encapsulation region; a plurality of display units disposed in the display region; an encapsulation member disposed in the border region; a plurality of wires disposed in the border region; and a cover substrate arranged opposite to the base substrate. The display units and the wires are disposed between the base substrate and the cover substrate, the encapsulation member is disposed in the encapsulation region and configured to bond and fix the base substrate to the cover substrate, and at least one of the wires is disposed in the encapsulation region.

20 Claims, 9 Drawing Sheets

(51) Int. Cl.
*H01L 51/52* (2006.01)
*G02F 1/1368* (2006.01)
*G02F 1/1333* (2006.01)

(52) U.S. Cl.
CPC ...... *G02F 2201/56* (2013.01); *G02F 2202/28* (2013.01); *H01L 2251/53* (2013.01)

(56) References Cited

U.S. PATENT DOCUMENTS

| | | | | |
|---|---|---|---|---|
| 2006/0087224 A1* | 4/2006 | Oki | ..................... | H01L 27/3276 313/504 |
| 2007/0090759 A1* | 4/2007 | Choi | ..................... | H01L 51/524 313/512 |
| 2007/0128967 A1* | 6/2007 | Becken | ............... | H01L 51/5246 445/25 |
| 2007/0170605 A1* | 7/2007 | Lee | ..................... | H01L 51/5246 264/1.1 |
| 2007/0170839 A1* | 7/2007 | Choi | ......................... | C03C 8/24 313/500 |
| 2007/0170859 A1* | 7/2007 | Choi | .................. | H01L 27/3276 313/512 |
| 2007/0176550 A1* | 8/2007 | Kwan | ................. | H01L 51/5246 313/512 |
| 2007/0194710 A1* | 8/2007 | Song | .................. | H01L 27/3276 313/512 |
| 2009/0058293 A1* | 3/2009 | Maeda | ................ | H01L 27/3276 313/512 |
| 2013/0048967 A1* | 2/2013 | Nishido | ................ | H05B 33/04 257/40 |
| 2013/0192332 A1* | 8/2013 | Scheffler | .......... | G01N 35/00693 73/1.06 |
| 2013/0213852 A1* | 8/2013 | Yamazaki | ................ | C03C 8/08 206/701 |
| 2013/0300284 A1* | 11/2013 | Nishido | ............. | H01L 51/0097 313/511 |
| 2014/0103312 A1* | 4/2014 | Huang | ................ | H01L 51/5246 257/40 |
| 2015/0021573 A1* | 1/2015 | Kwak | ................ | H01L 27/3253 257/40 |
| 2017/0194593 A1* | 7/2017 | Ma | ....... | H01L 51/5203 |
| 2017/0194595 A1* | 7/2017 | Li | ......................... | H01L 51/529 |
| 2018/0004247 A1* | 1/2018 | Liu | ....................... | H01Q 13/10 |
| 2018/0018051 A1* | 1/2018 | Ogura | ..................... | G06F 3/041 |

FOREIGN PATENT DOCUMENTS

| | | |
|---|---|---|
| CN | 101009311 A | 8/2007 |
| CN | 101191969 A | 6/2008 |
| CN | 101359647 A | 2/2009 |
| CN | 104332484 A | 2/2015 |
| JP | H0933933 A | 2/1997 |
| JP | H10282507 A | 10/1998 |

\* cited by examiner

US 10,224,385 B2

DISPLAY PANEL AND ELECTRONIC DEVICE

CROSS-REFERENCES TO RELATED APPLICATIONS

This application claims priority of Chinese Patent Application No. 201610279045.6, filed on Apr. 29, 2016, the entire contents of which are hereby incorporated by reference.

FIELD OF THE INVENTION

The present disclosure generally relates to the field of display technology and, more particularly, relates to a display panel and an electronic device thereof.

BACKGROUND

With the continuous development of science and technology, more and more electronic devices with display functions are used in people's daily life and work, which currently have brought great convenience to and become indispensable tools to ordinary people. Display panel is an essential component for the electronic device to achieve the display function. A display panel often has a display region and a border (or a frame) region. The display region is disposed with pixel units for displaying images, and the border region is disposed with scanning lines and signal lines of the pixel units, a frit metal, and an encapsulation member (e.g. sealing adhesive), etc.

To efficiently prevent moisture and oxygen from penetrating the display panel, the border region of the current display panel may be substantially wide, i.e., a narrow border region may be difficult to be achieved. Thus, the display panel may be bulky, and may require a large space to fit inside the electronic device.

The disclosed display panel and electronic device thereof are directed to solve one or more problems set forth above and other problems.

BRIEF SUMMARY OF THE DISCLOSURE

One aspect of the present disclosure provides a display panel. The display panel comprises a base substrate including a display region and a border region surrounding the display region, wherein the border region includes an encapsulation region; a plurality of display units disposed in the display region; an encapsulation member disposed in the border region; a plurality of wires disposed in the border region; and a cover substrate arranged opposite to the base substrate. The display units and the wires are disposed between the base substrate and the cover substrate, the encapsulation member is disposed in the encapsulation region and configured to bond and fix the base substrate to the cover substrate, and at least one of the wires is disposed in the encapsulation region.

Another aspect of the present disclosure provides an electronic device. The electronic device comprises a display panel. The display panel comprises a base substrate including a display region and a border region surrounding the display region, wherein the border region includes an encapsulation region; a plurality of display units disposed in the display region; an encapsulation member disposed in the border region; a plurality of wires disposed in the border region; and a cover substrate arranged opposite to the base substrate. The display units and the wires are disposed between the base substrate and the cover substrate, the encapsulation member is disposed in the encapsulation region and configured to bond and fix the base substrate to the cover substrate, and at least one of the wires is disposed in the encapsulation region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

Figure 1:
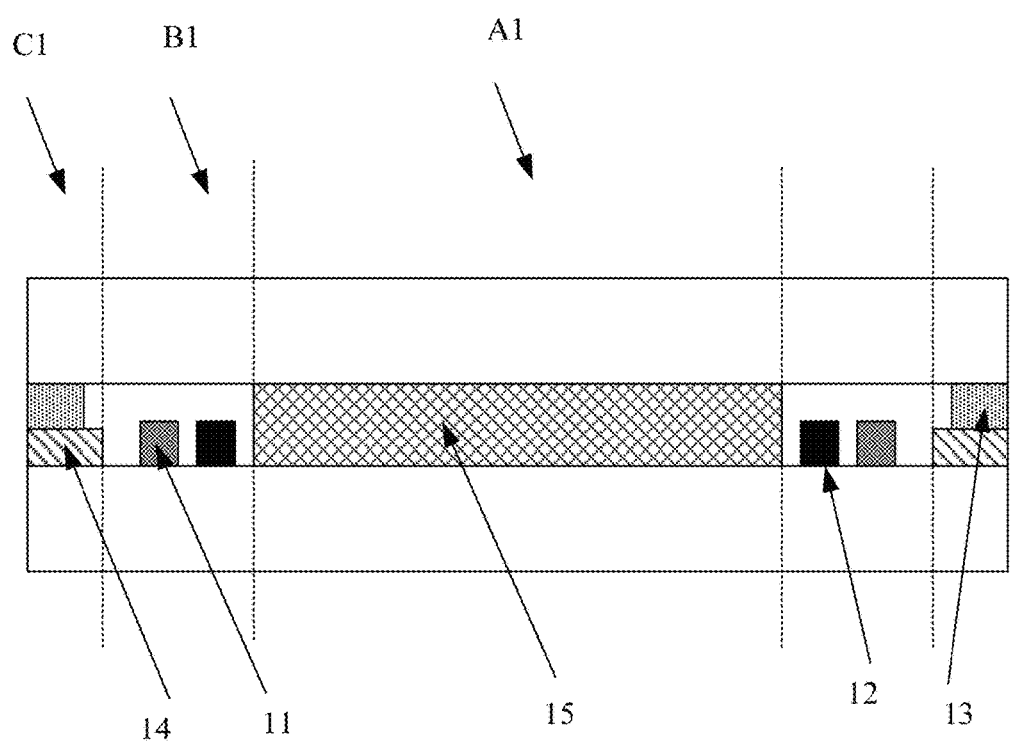
FIG. 1 illustrates a cross-sectional view of a current display panel.

FIG. 1 illustrates a cross-sectional view of a current display panel. As shown in FIG. 1, the current display panel includes a display region A1 and a border region surrounding the display region A1. The border region includes a wiring region B1 and an encapsulation region C1 surrounding the wiring region B1. A plurality of signal lines or data lines 11 and a plurality of scanning lines 12 are disposed in the wiring region B1. A plurality of display units 15 is disposed in the display region A1.

To reduce a height difference between the display region A1 and the border region and, meanwhile, to maintain a desired sealing effect of the encapsulation, a frit metal 14 is disposed in the encapsulation region C1, and an encapsulation member (e.g., sealing adhesive, encapsulation adhesive) 13 is disposed on the frit metal 14. The frit metal 14 may also be able to reflect incident laser and stand a high temperature, which may facilitate the processing of the encapsulation adhesive 13 to encapsulate the display panel.

Generally, in the current display panel, a region disposed with the data lines 11, a region disposed with the scanning lines 12, and the encapsulation region C1 are independent and separated from each other. To efficiently prevent moisture and oxygen from penetrating the display panel, the border region of the current display panel may be substantially wide. That is, a design of narrow border region may be difficult to be realized. Thus, the display panel may be bulky, and may require a large space to fit inside the electronic device.

In particular, as wearable electronic devices are emerging, such as smart watches and smart eyewear, a higher demand for the border width of display panel is raised. A wearable electronic device often has a substantially small display panel, in which a substantially narrow border width is highly desired, such that a relatively large display region may be achieved in a small-sized display panel.

Further, the display panel of wearable electronic device becomes more and more diversified. In addition to a traditional rectangular shape, the display panel may also have an irregular shape, such as a circular shape, an octagonal shape, etc., in which the wiring region, the encapsulation region, and the stepped area of the bonding pads may occupy a substantially large space in the border region. On the other hand, the encapsulation region, where the encapsulation member is disposed, is required to have a certain width to maintain the sealing effect. Thus, by taking both the encapsulation region and the wiring region into account, a wide border region, rather than a narrow border region, may be formed in the current display panel. The case may become even worse when more signal lines are introduced when the resolution of display panel keeps increasing.

The present disclosure provides an improved display panel. The display panel may include a base substrate and a cover substrate arranged opposite to the base substrate. The base substrate may include a display region, a border region surrounding the display region, a plurality of display units disposed in the display region, and an encapsulation member and a plurality of wires disposed in the border region. In particular, the display units and the wires may be disposed between the base substrate and the cover substrate. The encapsulation member may be configured to bond and fix the base substrate and the cover substrate. The border region may include an encapsulation region for disposing the encapsulation member, and at least part of the wires may be disposed in the encapsulation region.

Because at least part of the wires are disposed in the encapsulation region, the wires disposed in the encapsulation region may be adopted as the frit metal of the display panel. That is, the at least part of the wires disposed in the encapsulation region may be multiplexed as the frit metal without the need of any additional frit metal layer. Thus, the width of the border region may be reduced, and a display panel with a narrow border region may be realized accordingly.

Figure 2A:
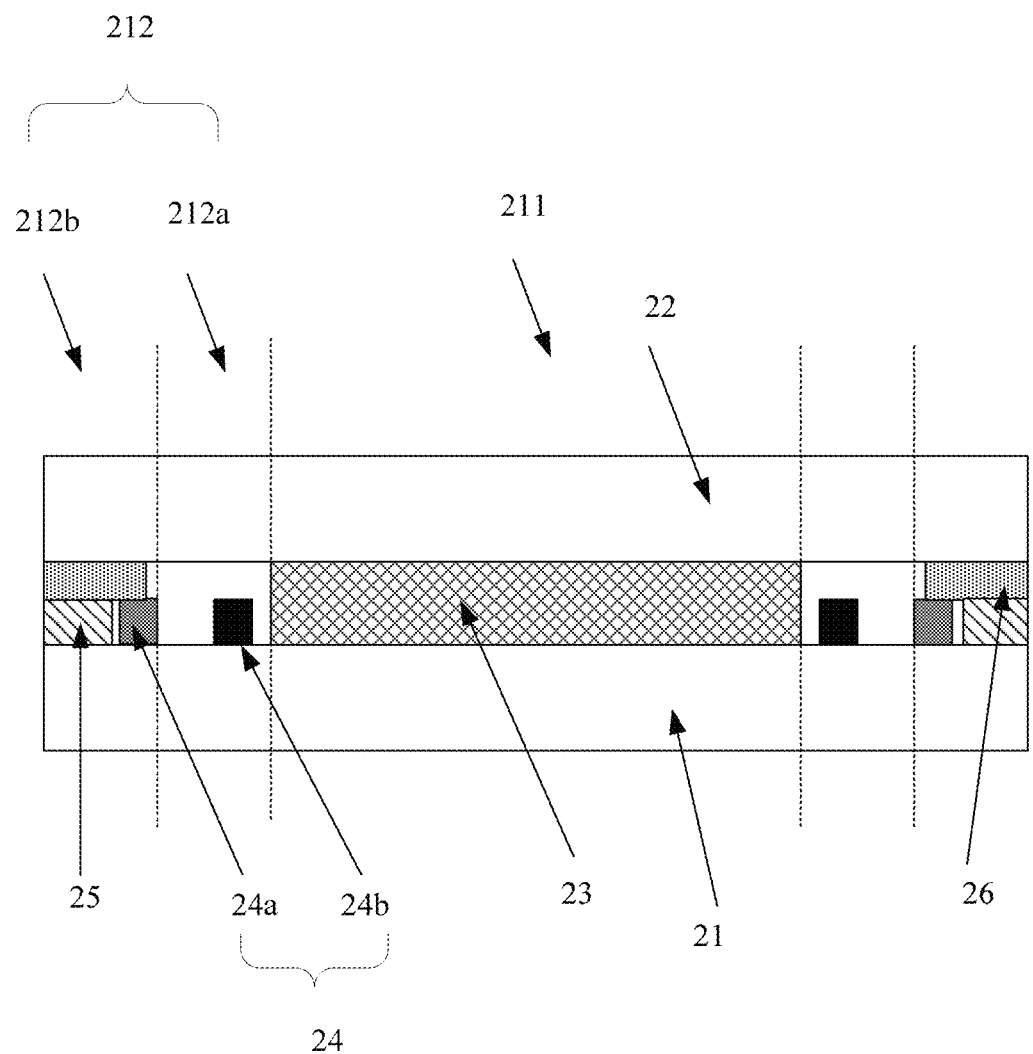
FIG. 2a illustrates a cross-sectional view of an exemplary display panel consistent with disclosed embodiments.

FIG. 2a illustrates a cross-sectional view of an exemplary display panel consistent with disclosed embodiments. As shown in FIG. 2a, the display panel may include a base substrate 21, a cover substrate 22, a plurality of display units 23, a plurality of wires 24, a peripheral metal layer 25, and an encapsulation member 26. The cover substrate 22 arranged opposite to the base substrate 21. The base substrate 21 may further include a display region 211, a border region or a frame region 212 surrounding the display region 211. The encapsulation member 26 may be any appropriate type of sealing adhesives or encapsulation adhesives, capable of encapsulating the display panel to prevent the display units from being damaged by the outside moisture and oxygen.

The display units 23 may be disposed in the display region 211, and the encapsulation member 26 and the wires 24 may be disposed in the border region 212. The display units 23 and the wires 24 may be disposed between the base substrate 21 and the cover substrate 22. The display units 23 may be any appropriate display units of the display panel for displaying images or image elements.

The display units 23 may be any appropriate type of display units capable of displaying videos and/or images, such as plasma display panel (PDP) display units, field emission display (FED) units, liquid crystal display (LCD) units, organic light-emitting diode (OLED) display units, light-emitting diode (LED) display units, quantum dots (QDs) display units, electrophoretic display units (i.e., e-readers) or other types of display units.

When the display unit 23 is the liquid crystal display (LCD) unit, the base substrate 21 may be a thin-film-transistor (TFT) array substrate, and the cover substrate 22 may be a color film substrate. The LCD units may include a liquid crystal layer, i.e., a layer of liquid crystal molecules.

When the display unit 23 is the organic light-emitting diode (OLED) display unit, the base substrate 21 may be a TFT array substrate, and the cover substrate 22 may be a substrate made of rigid materials or flexible materials, for example, a glass substrate or a flexible plastic substrate. The OLED display units may include a metal cathode, a metal anode arranged opposite to the metal cathode, and a light-emitting functional layer sandwiched between the metal cathode and the metal anode.

In particular, the encapsulation member 26 may be configured to bond and fix the base substrate 21 and the cover substrate 22. The border region 212 may further include an encapsulation region 212b for disposing the encapsulation member 26. At least part of the wires 24 may be disposed in the encapsulation region 212b. For example, in one embodiment, at least one of the wires 24 may be disposed in the encapsulation region 212b. In another embodiment, at least a segment of at least one of the wires 24 may be disposed in the encapsulation region 212b.

The peripheral metal layer 25 may be disposed in the encapsulation region 212b of the border region 212. For example, the peripheral metal layer 25 may surround the at least part of the wires 24 disposed in the encapsulation region 212b, but may have a certain space with respect to the at least part of the wires 24 disposed in the encapsulation region 212b. In particular, the peripheral metal layer 25 and the at least part of the wires 24 disposed in the encapsulation region 212b may form a frit metal, which may increase the adhesive force between the base substrate 21 and the encapsulation member 26.

In the disclosed embodiments, the encapsulation member 26 may be glass frit disposed in the encapsulation region 212b. The glass frit may be melted through a laser heating process, and be solidified again after cooling down, such that the base substrate 21 and the cover substrate 22 may be bonded and fixed to each other. For example, a laser beam may be incident on the glass frit, which may be melted due to the generated heat and solidified again after cooling down. The peripheral metal layer 25 and the at least part of the wires 24 disposed in the encapsulation region 212b may reflect the laser beam transmitted through the glass frit, improving the melting efficiency of the glass frit and enabling a more uniform laser heating process. Thus, the glass frit may be sufficiently melted, and a desired sealing effect may be achieved.

Further, due to the display units 23 disposed in the display region 211 of the base substrate 21, the encapsulation region 212b and the display region 211 may have a substantially large height difference. For example, the height of the display region 211 may be much greater than the height of the encapsulation region 212b. Thus, if the base substrate 21 and the cover substrate 22 are bonded and fixed to each other only through the encapsulation member 26 disposed in the encapsulation region 212b, the encapsulation member 26 may have a substantially large thickness, i.e., the encapsulation member 26 may be substantially thick.

The encapsulation member 26 with a larger thickness may lead to an insufficient melt of the encapsulation member 26 and a degraded sealing effect. The encapsulation member 26 with a larger thickness may also require longer curing time for bonding the base substrate 21 and the cover substrate 22, and may even overflow into the edges of the display region 211, introducing a pollution to the display units 23 and degrading the image performance of the display panel.

In the disclosed embodiments, the peripheral metal layer 25 may reduce the height difference between the display region 211 and the encapsulation region 212b, and accordingly reduce the thickness of the encapsulation member 26, which may be highly desired for the sealing and encapsulation of the base substrate 21 and the cover substrate 22. Meanwhile, the adhesive force between the base substrate 21 and the encapsulation member 26 may be enhanced, and the cover substrate 22 may be prevented from falling off.

As shown in FIG. 2a, the peripheral metal layer 25 and the wires 24 may be formed by a same conductive layer. During a fabrication process of the display panel, a conductive layer may be formed in the border region, and the peripheral metal layer 25 and the wires 24 may be formed through patterning the conductive layer. In particular, the conductive layer may be formed by chemical vapor deposition or other deposition processes, then patterned through a photolithography process or a laser etching process. In certain embodiments, the peripheral metal layer 25 and the wires 24, which may have a predetermined pattern, may also be directly formed by metal evaporation and deposition through a mask having a corresponding predetermined pattern.

As shown in FIG. 2a, at least part of the wires 24 may be disposed in the encapsulation region 212b. In this case, the border region 212 may further include a wiring region 212a. The wiring region 212a may surround the display region 211, and the encapsulation region 212b may surround the wiring region 212a. The wires 24 may include a plurality of first type wires 24b and a plurality of second type wires 24a. The first type wires 24b may be disposed in the wiring region 212a, and the second type wires 24a may be disposed in the encapsulation region 212b. The plurality of first type wires 24b may be electrically insulated from each other, the plurality of second type wires 24a may be electrically insulated from each other, and the first type wires 24b may be electrically insulated from the second type wires 24a. The peripheral metal layer 25 may be electrically insulated from the first type wires 24b and the second type wires 24a, respectively.

It should be noted that, in the disclosed embodiments, the wires 24 may provide scanning signals or data signals to the display units 23, corresponding to scanning lines or data lines. The numbers of the wires 24 may correspond to the number of the pixel units in the display units 23. FIG. 2a only illustrates the distribution of the wires 24 in the display panel, while the number of the wires 24 shown in FIG. 2a is only for illustrative purposes and is not intended to limit the scope of the present disclosure.

Further, the second type wires 24a disposed in the encapsulation region 212b may enhance the adhesive force between the base substrate 21 and the encapsulation member 26. In the current display panel, the base substrate 21 often has a smooth surface. Thus, directly coating the encapsulation member 26 in the encapsulation region 212b may result a substantially small adhesive force between the base substrate 21 and the encapsulation member 26, as well as, a poor sealing effect. As contrary, in the disclosed embodiments, the second type wires 24a may be disposed in the encapsulation region 212b, thus, the surface roughness of the encapsulation region 212b may be enhanced by the second type wires 24a, and the adhesive force between the base substrate 21 and the encapsulation member 26 may be enhanced accordingly.

In particular, the distribution density and/or the shape of the second type wires 24a may be specifically designed to enhance the adhesive force between the base substrate 21 and the encapsulation member 26. In one embodiment, the distribution density of the second type wires 24a may be specifically designed to enhance the adhesive force between the base substrate 21 and the encapsulation member 26. The distribution density of the first type wires 24b may be different from the distribution density of the second type wires 24a, while the shape of the first type wires 24b may be the same as the shape of the second type wires 24a.

Different distribution density of the second type wires 24a may correspond to different values of surface roughness of the encapsulation region 212b. Thus, the distribution density of the second type wires 24a may be specifically selected, such that a desired surface roughness or a preset value of the surface roughness of the encapsulation region 212b may be achieved.

For example, the distribution density of the second type wires 24a may be larger than distribution density of the first type wires 24b. Thus, the encapsulation member 26 may be not only attached onto the surface of the second type wires 24a, but also attached to the surface of the encapsulation region 212b in a large attaching surface. Thus, the adhesive force between the base substrate 21 and the encapsulation member 26 may be enhanced.

In another embodiment, the shape of the second type wires 24a may be specifically designed to enhance the adhesive force between the base substrate 21 and the encapsulation member 26. For example, the second type wire 24a may include a plurality of hollow patterns, such that the encapsulation member 26 may be not only attached to the surfaces of the second type wires 24a, but also attached to the base substrate 21 through the hollow patterns. The contact areas between the encapsulation member 26 and the base substrate 21 may be increased by the hollow patterns, and the adhesive force between the base substrate 21 and the encapsulation member 26 may be enhanced accordingly. The hollow patterns may include polygons, circles or a combination of various shapes.

In another embodiment, both the distribution density and the shape of the second type wires 24a may be specifically designed to enhance the adhesive force between the base substrate 21 and the encapsulation member 26. For example, the distribution density of the second type wires 24a may be larger than distribution density of the first type wires 24b and, meanwhile, the second type wire 24a may include a plurality of hollow patterns. Thus, the adhesive force between the base substrate 21 and the encapsulation member 26 may be further enhanced.

In the current display panel with a predetermined resolution, a preset number of wires are often required. Due to the fabrication limitation of the wires, the width of the smallest wiring region is fixed, i.e., the wiring region has a fixed smallest width. Meanwhile, to maintain a desired sealing effect, the width of the smallest encapsulation region is fixed, i.e., the encapsulation region has a fixed smallest width. The frit metal having a fixed width is disposed in the encapsulation region, and the encapsulation member is disposed on the surface of the frit metal. The wires are disposed in the wiring region. Due to the fixed width of the frit metal and the fixed smallest width of the wiring region, the border region of the current display panel may not be further reduced to realize a design of narrow border region.

However, in the disclosed display panel, as discussed above, the peripheral metal layer 25 and the at least part of the wires 24 disposed in the encapsulation region 212b may form the frit metal. In particular, the second type wires 24a may be disposed in the encapsulation region 212b, and multiplexed as part of the frit metal. That is, the second type wires 24a may be not only function as the wires, but also function as part of the frit metal. Thus, the wiring region 212a may be only disposed with the first type wires 24b. The width of the wiring region 212a may be reduced, and the width of the border region 212 may also be reduced accordingly.

Although the width of the border region 212 is reduced, the sealing effect of the border region 212 of the display panel may be unaffected. Instead, the second type wires 24a functioning as the frit metal may increase the adhesive force between the base substrate 21 and the encapsulation member 26. Meanwhile, the peripheral metal layer 25, the first type wires 24b, and the second type wires 24a may be formed by the same conductive layer, simplifying the fabrication process of the display panel.

Further, in the current display panel, the wire often has a width of 3 μm-4 μm, and the corresponding resistance is large. In the disclosed display panel, the wires 24 may be partly disposed in the encapsulation region 212b, i.e., the second type wires 24a may be disposed in the encapsulation region 212b while the first type wires 24b may be disposed in the wiring region 212a. Thus, both the encapsulation region 212b and the wiring region 212a may include fewer wires 24 if the total number of the wires is fixed. In addition to the narrow border region of the display panel, the width of each wire 24 may be appropriately increased, and the corresponding resistance may be reduced.

The width of the second type wire 24a and the width of the first type wires 24b may be determined based on various requirements, such as the size of the border region, the resistance of the wires, the number of the wires, and/or the spacing between the two adjacent wires, etc. The width of the second type wire 24a and the width of the first type wires 24b may also be determined based on various application scenarios.

In one embodiment, the second type wire 24a and the first type wires 24b may have a width of approximately 5 μm-10 μm (including 5 μm and 10 μm), respectively. For example, to simultaneously reduce the width of the border region and the resistance of the wires, the second type wires 24a and the first type wires 24b may be configured to have a width of approximately 7 μm, respectively.

Further, in one embodiment, the first type wires 24b and the second type wires 24a may have a same shape. In another embodiment, the shape of the first type wires 24b may be different from the shape of the second type wires 24a. For example, the second type wire 24a may have a larger width than the first type wires 24b. All the second type wires 24a may have a same shape, such that the second type wires 24a may have a same resistance and may be able to transmit a same type of electrical signals. The electrical signal may be a data signal or a scan signal.

On the other hand, all the first type wires 24b may also have a same shape, such that the first type wires 24b may have a same resistance, and may be able to transmit a same type of electrical signals. That is, all the second type wires 24a may be configured to transmit a same type of electrical signals, and all the first type wires 24b may be configured to transmit a same type of electrical signals. However, the electrical signals transmitted by the second type wires 24a may be different from the electrical signals transmitted by the first type wires 24b.

For example, in one embodiment, the second type wires 24a may be signal lines or data lines, providing data signals to the pixel units in the display units 23, while the first type wires 24b may be scanning lines, providing the scanning signals to the pixel units in the display units 23. In another embodiment, the second type wires 24a may be scanning lines, providing the scanning signals to the pixel units in the display units 23, while the first type wires 24b may be signal lines or data lines, providing data signals to the pixel units in the display units 23.

Further, in one embodiment, the second type wires 24a may include all the data lines, while the first type wires 24b may include all the scanning lines. In another embodiment, the second type wires 24a may include all the scanning lines, while the first type wires 24b may include all the data lines. In another embodiment, the first type wires 24b may include some of the data lines and some of the scanning lines, and the second type wires 24a may include some of the data lines and some of the scanning lines.

In another embodiment, the second type wires 24a may include some of the data lines, while the first type wires 24b may include some of the data lines and all the scanning lines. In another embodiment, the second type wires 24a may include some of the scanning lines, while the first type wires 24b may include some of the scanning lines and all the data lines. In another embodiment, the first type wires 24b may include some of the data lines, while the second type wires 24a may include some of the data lines and all the scanning lines. In another embodiment, the first type wires 24b may include some of the scanning lines, while the second type wires 24a may include some of the scanning lines and all the data lines.

Accordingly, the first type wires 24b and the second type wires 24a shown in FIG. 2a only illustrate the wires in the encapsulation region 212b and the wires in the wiring region 212a, respectively, while not distinguishing the shapes of the first type wires 24b and the second type wires 24a. In particular, when the first type wires 24b and the second type wires 24a transmit the same type of electronic signals, the first type wires 24b and the second type wires 24a may have a same shape. In contrary, when the first type wires 24b and the second type wires 24a transmit different types of electronic signals, the first type wires 24b and the second type wires 24a may have different shapes.

In the display panel shown in FIG. 2a, the peripheral metal layer 25 and the at least part of the wires 24 disposed in the encapsulation region 212b may form the frit metal. In particular, the second type wires 24a may be disposed in the encapsulation region 212b, and may be multiplexed as part of the frit metal. In certain embodiments, when at least part of the wires are disposed in the encapsulation region, the display panel may multiplex the wires disposed in the encapsulation region as the entire frit metal. The corresponding structure is illustrated in FIG. 2b, in which the peripheral metal layer may be the wires of the display panel, and the wires disposed in the encapsulation region may be multiplexed as the entire frit metal.

Figure 2B:
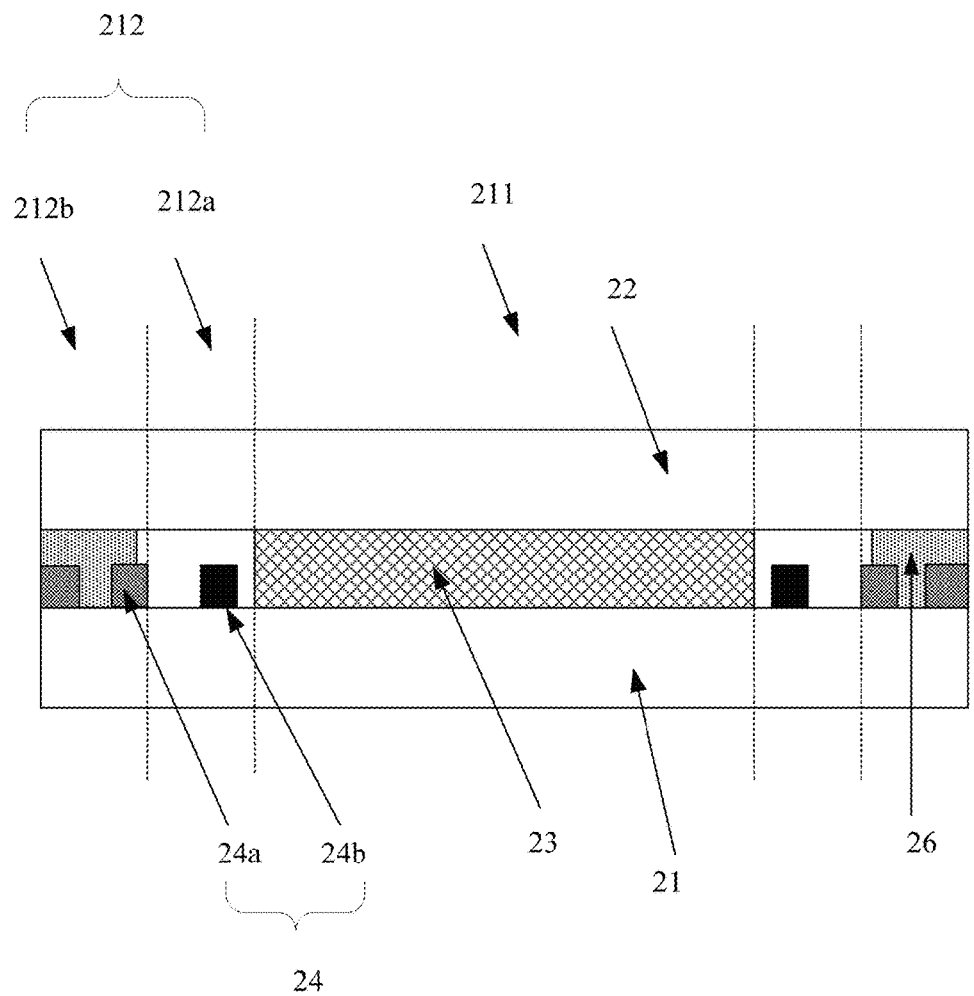
FIG. 2b illustrates a cross-sectional view of another exemplary display panel consistent with disclosed embodiments.

FIG. 2b illustrates a cross-sectional view of another exemplary display panel consistent with disclosed embodiments. As shown in FIG. 2b, at least partly of the wires 24 may be disposed in the encapsulation region 212b of the border region 212, and the at least part wires 24 disposed in the encapsulation region 212b may be multiplexed as the entire frit metal. Thus, a separate frit metal (i.e., a peripheral metal layer) may be no longer required, and the border region may be further reduced.

Figure 3A:
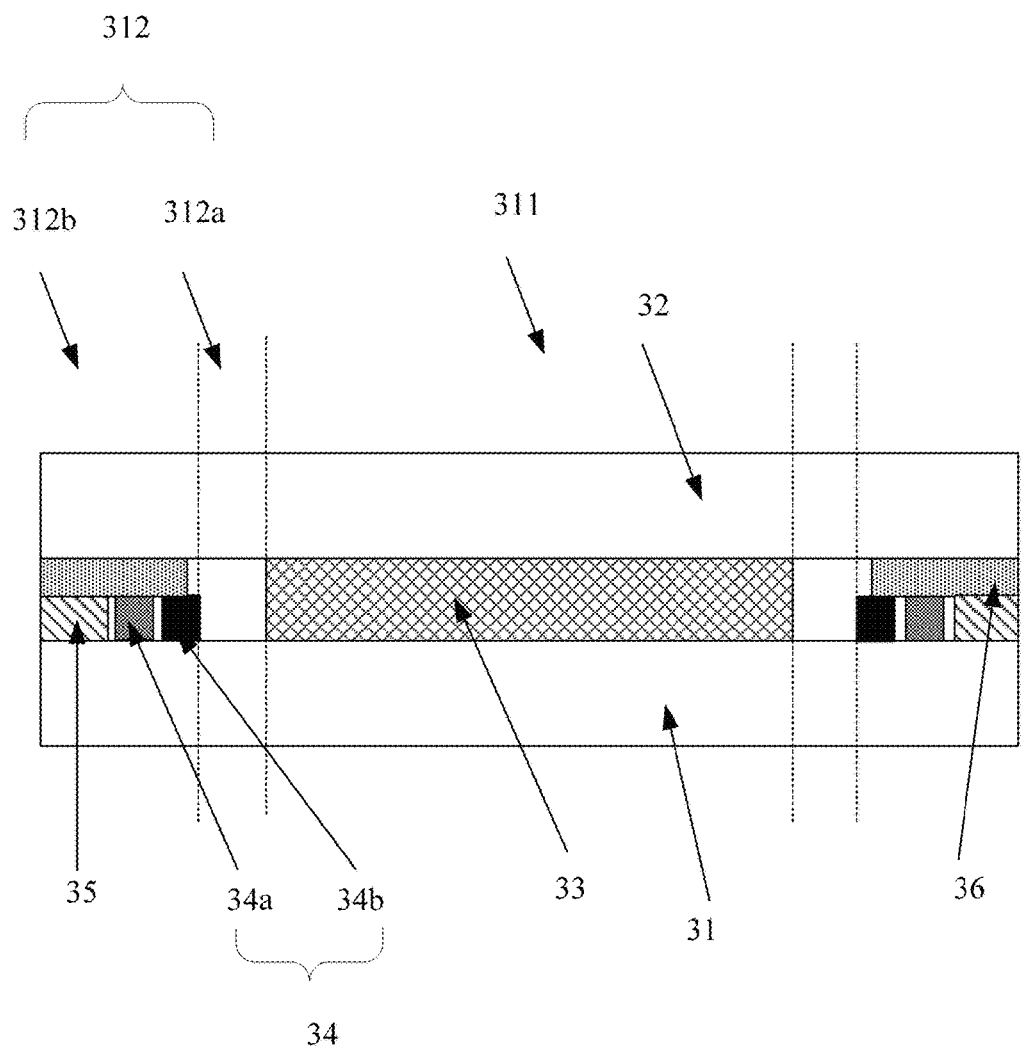
FIG. 3a illustrates a cross-sectional view of another exemplary display panel consistent with disclosed embodiments.

FIG. 3a illustrates a cross-sectional view of another exemplary display panel consistent with disclosed embodiments. The similarities between FIG. 3a and FIG. 2a are not repeated here, while certain differences may be explained. As shown in FIG. 3a, the display panel may include a base substrate 31, and a cover substrate 32 arranged opposite to the base substrate 31. The base substrate 31 may further include a display region 311 and a border region 312. The border region 312 may surround the display region 311.

A plurality of display units 32 may be disposed on the display region 311, and a plurality of wires 34 and an encapsulation member 36 may be disposed on the border region 312. The border region 312 may further include an encapsulation region 312b and a buffer region 312a. The encapsulation member 36 may be disposed in the encapsulation region 312b, and may be configured to bond and fix the base substrate 31 and the cover substrate 32. The buffer region 312a may surround the display region 311, and the encapsulation region 312b may surround the buffer region 312a. The buffer region 312a may prevent a pollution of the display units 33 when the encapsulation member 36 overflows beyond the encapsulation region 312b.

The display panel shown in FIG. 3a and the display panel shown in FIG. 2a may have different layouts of the border region. As shown in FIG. 3a, all the wires 34 may be disposed in the encapsulation region 312b. The wires 34 may include a plurality of data lines or signal lines 34a and a plurality of scanning liens 34b. All the wires 34 may be electrically insulated from each other.

The display panel may further include a peripheral metal layer 35, which may be disposed surrounding all the wires 34 and electrically insulated from the wires 34. All the wires 34 and the peripheral metal layer 35 may form a frit metal. That is, all the wires 34 may be multiplexed as part of the frit metal. Further, all the wires 34 and the peripheral metal layer 35 may be formed in a same layer and may be fabricated by a same conductive layer. When all the wires 34 are multiplexed as the frit metal, the width of the border region 31 may be significantly reduced.

Similar to the display panel shown in FIG. 2a, in the display panel shown in FIG. 3a, the distribution density and/or the shape of the wires 34 (e.g., disposing hollow patterns in wires) may be specifically designed to enhance the adhesive force between the base substrate 31 and the encapsulation member 36.

In certain embodiments, when all the wires 34 are disposed in the encapsulation region, the display panel may completely multiplex all the wires 34 as the entire frit metal. The corresponding structure is illustrated in FIG. 3b, in which the peripheral metal layer may be the wires of the display panel, and all the wires disposed in the encapsulation region may be multiplexed as the entire frit metal.

Figure 3B:
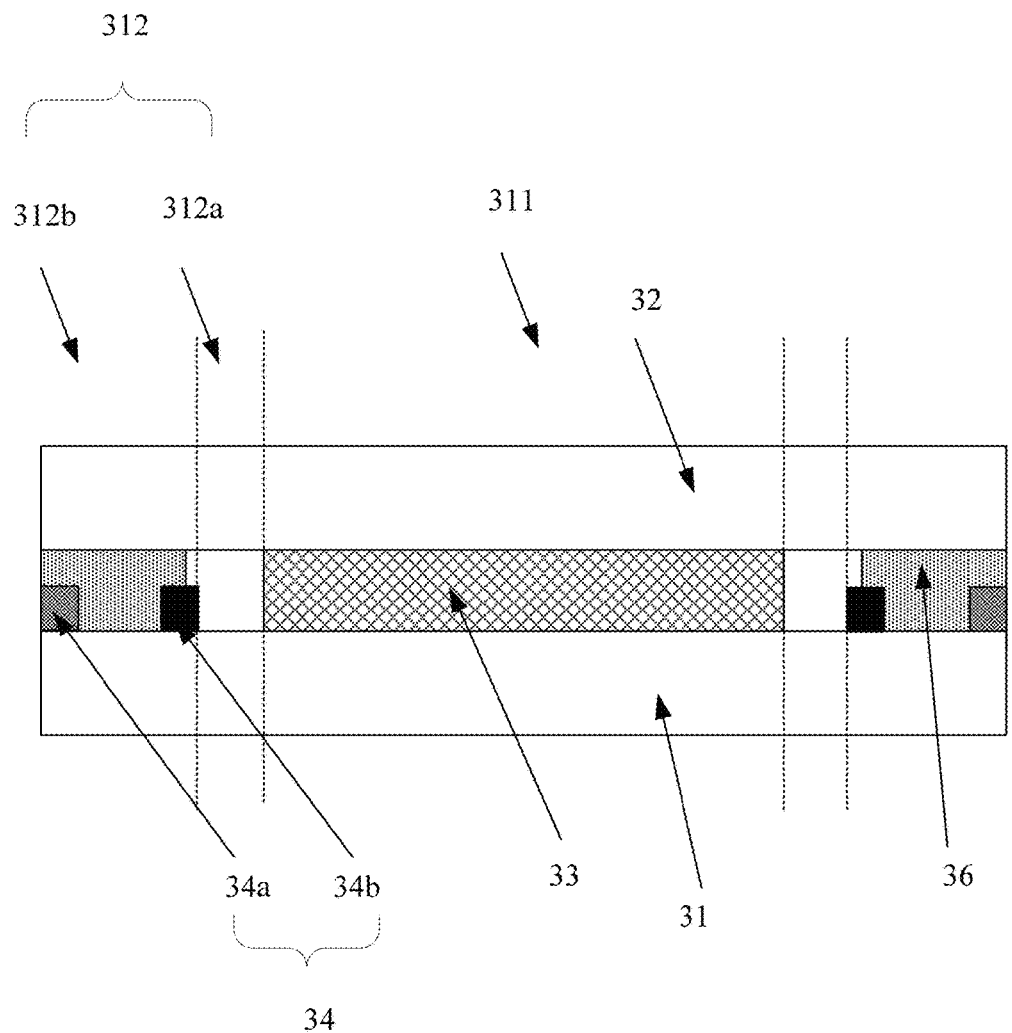
FIG. 3b illustrates a cross-sectional view of another exemplary display panel consistent with disclosed embodiments.

FIG. 3b illustrates a cross-sectional view of another exemplary display panel consistent with disclosed embodiments. Certain differences between FIG. 3a and FIG. 3b is explained as follows. In the display panel shown in FIG. 3a, the peripheral metal layer 35 and the wires 34 disposed in the encapsulation region 312b may form the frit metal. As a comparison, in the display panel shown in FIG. 3b, a separate frit metal (i.e., a peripheral metal layer) may be no longer required, because the wires 34 disposed in the encapsulation region 312b may be multiplexed as the entire frit metal. Thus, the border region 312 may be further reduced.

In the disclosed embodiments, when at least part of the wires are disposed in the encapsulation region, all the data lines or all the scanning lines may be disposed in the encapsulation region to maintain a simple fabrication process. The border region of the display panel may include the wiring region and the encapsulation region. The wiring region may surround the display region, and the encapsulation region may surround the wiring region.

The wires may include a plurality of signal lines or data lines, and a plurality of scanning lines. In one embodiment, the signal lines may be disposed in the encapsulation region, while the scanning lines may be disposed in the wiring region. In another embodiment, the scanning lines may be disposed in the encapsulation region, while the signal lines may be disposed in the wiring region.

The materials of the wires may be molybdenum or alloys of molybdenum and niobium. When the periphery metal layer and the wires are disposed in the same layer, the periphery metal layer may have a same material as the wires.

In the display panels shown in FIGS. 2a and 3a, the wires disposed in the encapsulation region and the periphery metal layer may be disposed in the same layer. The wires of the display panel and the periphery metal layer may be formed in the same layer, and the wires disposed in the encapsulation region may be disposed between the cover substrate and the periphery metal layer. In certain embodiments, the wires disposed in the encapsulation region, as well as, the periphery metal layer, may be disposed in different layers, and the corresponding structure is shown in FIG. 4.

Figure 4:
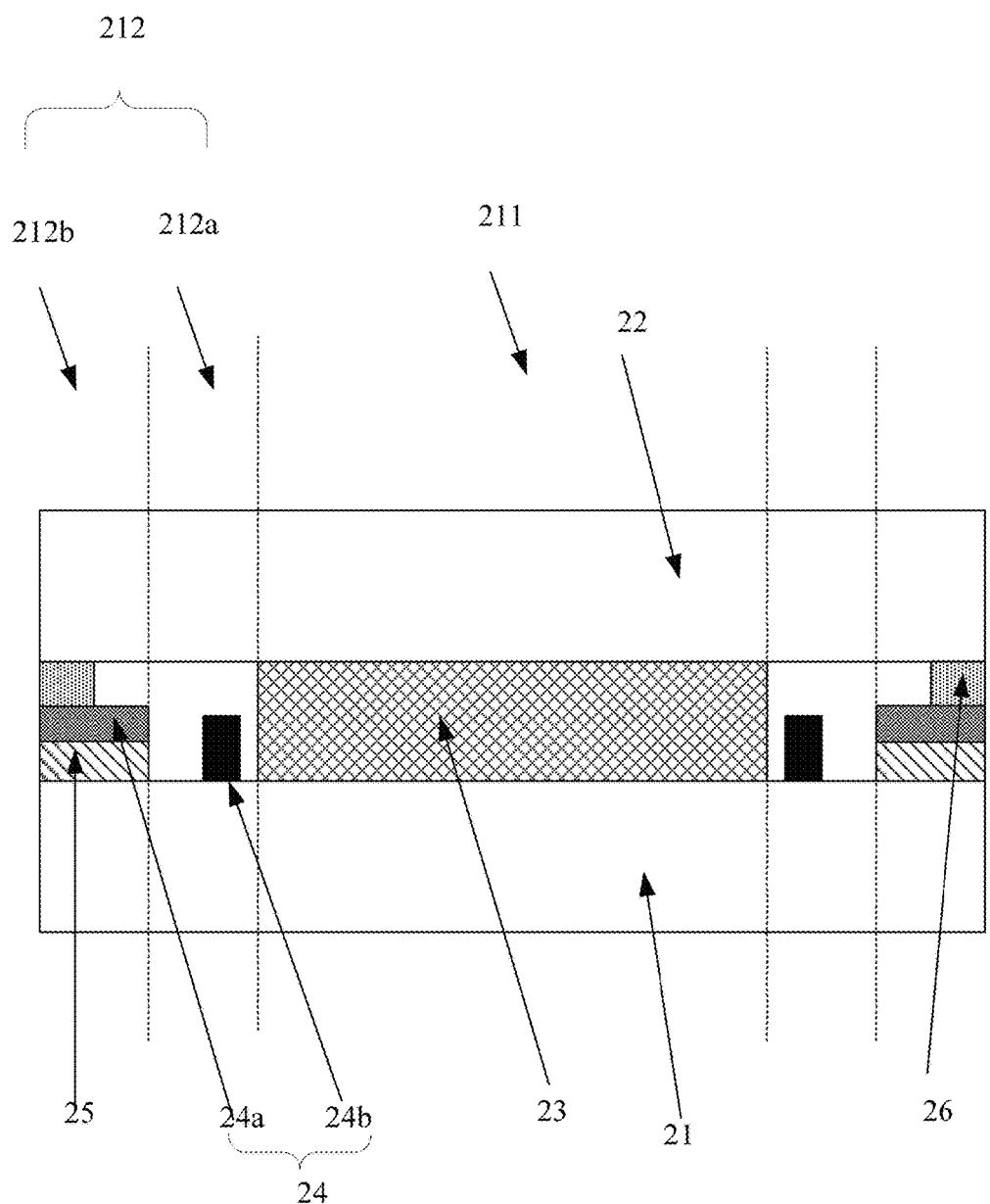
FIG. 4 illustrates a cross-sectional view of another exemplary display panel consistent with disclosed embodiments.

FIG. 4 illustrates a cross-sectional view of another exemplary display panel consistent with disclosed embodiments. The display panel shown in FIG. 4 is similar to the display panel shown in FIG. 2a, and the same reference numbers will be used throughout FIG. 4 and FIG. 2a to refer to the same or like parts. Certain differences between the display panel shown in FIG. 4 and the display panel shown in FIG. 2a may be explained as follows.

In the display panel shown in FIG. 4, the wires 24 may be disposed between the periphery metal layer 25 and the cover substrate 22. The wires 24 may be electrically insulated from the periphery metal layer 25 through disposing an insulating layer (not drawn in FIG. 4) on the surface of the periphery metal layer 25. Thus, the display panel shown in FIG. 4 may further reduce the width of the border region, as compared to the display panel shown in FIG. 2a.

In another embodiment, when the wires disposed in the encapsulation region and the periphery metal layer are disposed in different layers, the wires disposed in the encapsulation region may be disposed between the periphery metal layer and the base substrate. The wires disposed in the encapsulation region and other wires in the display panel may be formed by a same conductive layer.

Figure 5:
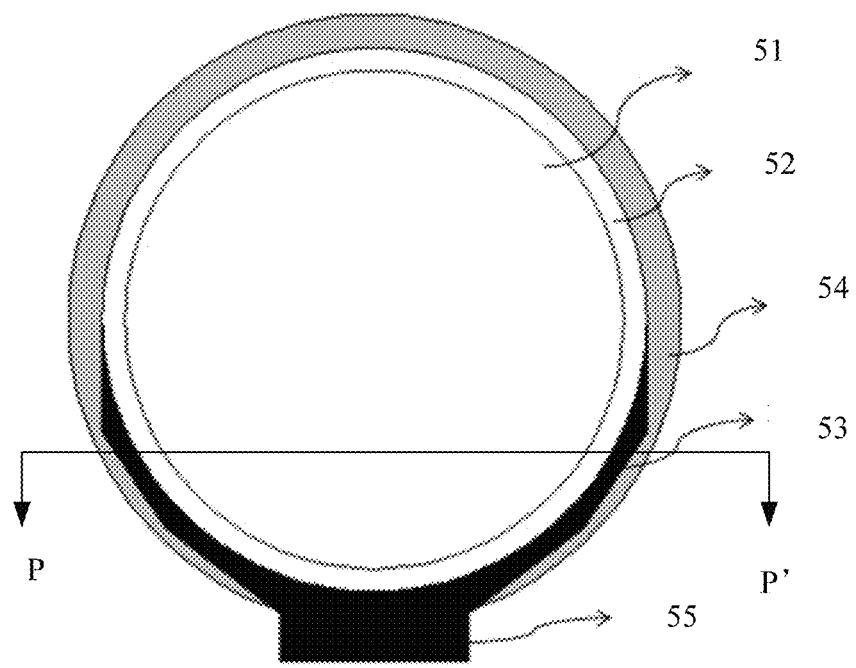
FIG. 5 illustrates a top view of an exemplary display panel consistent with disclosed embodiments.

As discussed above, the display panels of wearable electronic devices become more and more diversified. In addition to a traditional rectangular shape, the display panel may also have an irregular shape, such as a circular shape, an octagonal shape, etc. FIG. 5 illustrates a top view of another exemplary display panel consistent with disclosed embodiments.

As shown in FIG. 5, the display panel may have a circular shape, which may include a display region 51, a border region including an encapsulation region 54, a preset region 52, and a stepped area 55. The border region may surround the display region 51. A plurality of display units may be disposed in the display region 51, and a plurality of wires and an encapsulation member may be disposed in the border region. The connecting terminals of the wires may be disposed in the stepped area 55.

Further, the encapsulation region 54 may further include a sub-encapsulation region 53. The encapsulation member may be disposed in the encapsulation region 54. The preset region 52 may be disposed between the encapsulation region 54 and the display region 51. In one embodiment, at least part of the wires of the display panel may be disposed in the sub-encapsulation region 53 of the encapsulation region 54, and the preset region 52 may function as a wiring region in which the remained wires may be disposed. That is, among all the wires of the display panel, some may be disposed in the sub-encapsulation region 53, and the remained may be disposed in the preset region 52.

In another embodiment, all the wires of the display panel may be disposed in the sub-encapsulation region 53. The preset region 52 may function as a buffer region, which may prevent a pollution of the display units when the encapsulation member overflows beyond the encapsulation region 54.

It should be noted that, the display panel shown in FIG. 5 may have a PP' cross-sectional view shown in, but not limited to, FIGS. 2a-2b, FIGS. 3a-3b and FIG. 4.

Figure 6:
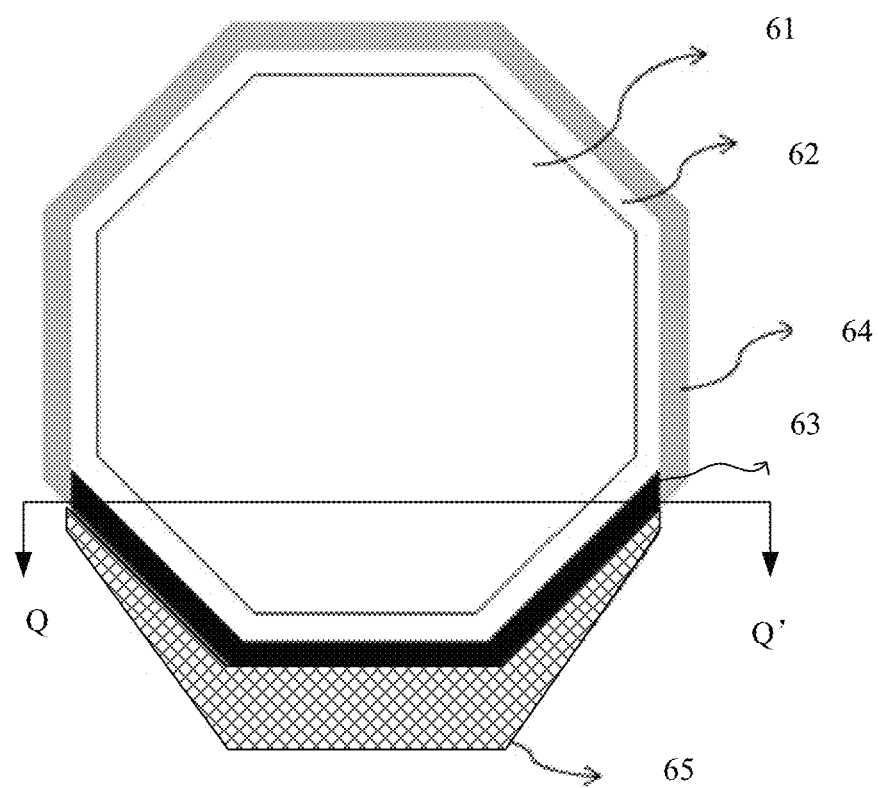
FIG. 6 illustrates a top view of another exemplary display panel consistent with disclosed embodiments.

FIG. 6 illustrates a top view of another exemplary display panel consistent with disclosed embodiments. The similarities between FIG. 5 and FIG. 6 are not repeated here, while certain differences may be explained. As shown in FIG. 6, the display panel may have an octagonal shape. The display panel may include a display region 61, a border region including include an encapsulation region 64, a preset region 62, and a stepped area 65. The border region may and surround the display region 61. The display region 61 may be disposed with a plurality of display units, and the border region may be disposed with a plurality of wires and encapsulation member.

Further, the border region may include an encapsulation region 64, and the encapsulation region 64 may further include a sub-encapsulation region 63. The preset region 62 may be disposed between the encapsulation region 64 and the display region 61. The encapsulation member and the wires may be disposed in the encapsulation region 64. The connecting terminals of the wires may be disposed in the stepped area 65.

The display panel shown in FIG. 5 and the display panel shown in FIG. 6 may only have different display panel shapes, while the relative position of the various regions in the display panel may be the same.

It should be noted that, the display panel shown in FIG. 6 may have a PP' cross-sectional view shown in, but not limited to, FIGS. 2a-2b, FIGS. 3a-3b and FIG. 4.

Further, the circular-shaped display panel shown in FIG. 5 and the octagonal-shaped display panel shown in FIG. 6 are only for illustrative purposes, and are not intended to limit the scope of the present disclosure. In certain embodiments, the display panel may also have a rectangular shape, a triangular shape, etc.

In particular, when the display panel is an OLED display panel including a plurality of OLED display units, due to the high demand for moisture and oxygen barrier properties, the OLED display panel is often encapsulated or sealed with high performance glass frit. To maintain a desired isolation of the moisture and oxygen, the width of the encapsulation region in traditional OLED display panels may not be reduced without limitation. As the border region in the electronic device with a display function is continuously shrinking, developing a large variety of display panels with a narrow border region is highly desired to satisfy a market demand of the wearable electronic devices.

Wearable electronic devices often have diversified shapes, such as a rectangular shape, a circular shape, an octagonal shape, etc. In particular, when the wearable electronic device has a circular-shaped or an octagonal-shaped display panel, in such irregular-shaped display panels, the stepped area of the display panel, the pixel units and the wires often occupy a substantially large space in the border region. On the other hand, to maintain a desired sealing effect, the border region is required to have a certain width for realizing the encapsulation. Thus, a wide or a large border region may be formed, increasing difficulties to realize a design of narrow border region. In addition, as the resolution of the display panel increases, more wires may be introduced into the display panel, which may further increase the difficulties to realize a narrow border region.

In the disclosed embodiments, the display panel may multiplex at least part of the wires as the frit metal disposed in the encapsulation region, such that the width of the border region may be reduced, and a display panel with border region may be realized accordingly. In particular, for the wearable electronic device, the shape of the display panels may be specifically designed according to the various requirement of the wearable electronic device. The fabrication cost may be low, and the border region of the display panel may be narrow, which may be highly desired to realize wearable electronic devices with a narrow border region.

Further, when the disclosed display panels are implemented into wearable electronic devices, the border region may be effectively reduced. As discussed above, the display panels of wearable electronic devices often have diversified shapes. In addition to a traditional rectangular shape, most display panels have an irregular shape, such as a circular shape, an octagonal shape, etc., in which the border region of the display panel is substantially large.

For example, in the existing technology, a 360*360 circular display panel, i.e., a circular display panel having 360 pixels in the diameter direction, is often disposed with a total number of 540 signal lines, in which each wire has a width of 3 μm-4 μm. If the 540 signal lines are divided into two groups, which are respectively disposed in two sides of a diameter of the circular display panel, a number of 270 signal lines are disposed in each side, and each corresponding region has a width of 1080 μm.

However, in the disclosed embodiments, for a same 360*360 circular display panel having 540 wires, all the 540 wires may be disposed in the encapsulation region. Thus, the region having a width of 1080 μm for disposing the 270 wires in each side may be no longer required, and the width of the border region may be reduced by approximately 1.0 mm. In addition to reducing the width of the border region, the width of the wires may be increased. For example, the width of the border region may be reduced by approximately 1.0 mm, and the width of the wires may be increased to 7 µm. Thus, the corresponding resistance of the wire may be reduced, and the driving capability of the display driving circuit may be improved.

Figure 7:
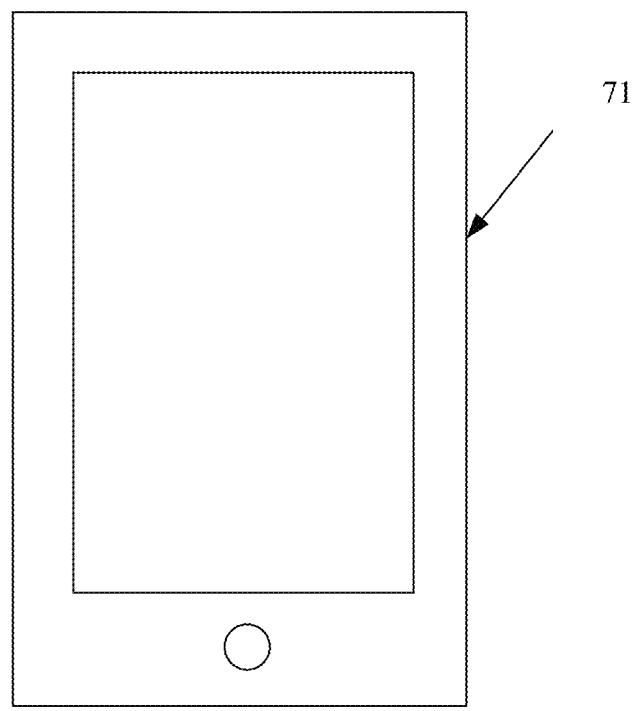
FIG. 7 illustrates a top view of an exemplary electronic device consistent with disclosed embodiments.

The present disclosure also provides an improved electronic device. FIG. 7 illustrates a top view of an exemplary electronic device consistent with disclosed embodiments. As shown in FIG. 7, the electronic device may include a display panel 71, which may be any of the disclosed display panels. The disclosed electronic device may be a smart wearable device, a tablet, a TV, a smartphone, a notebook, and, a digital frame, etc. Further, the electronic device may be any appropriate type of content-presentation devices.

Because the disclosed electronic device includes any of the disclosed display panels, the disclosed electronic device may also exhibit the same advantages as the disclosed display panels. That is, through multiplexing at least part of the wires as the frit metal disposed in the encapsulation region, the width of the border region of the display panel may be reduced. Thus, the border region of the electronic device may shrink while the display region may keep unchanged.

In the disclosed embodiments, at least part of the wires may be disposed in the encapsulation region, such that the at least part of the wires disposed in the encapsulation region may be multiplexed as the frit metal of the display panel. The width of the border region may be reduced, and a display panel with a narrow border region may be realized accordingly. Meanwhile, the width of the wires may also be increased, such that the corresponding resistance of the wires may be reduced, and the driving capability of the display driving circuit may be improved.

The disclosed display panel with a shrunk border region may be highly desired in wearable electronic devices. In addition, the disclosed electronic device with a shrunk border region may save precious space when the electronic device is further implemented into other devices. For example, a circular speedometer with a shrunk border region may save precious space in a vehicle's crowded dashboard, which also requires room for car-navigation displays and other recent additions.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display panel, comprising:
a base substrate including a display region and a border region surrounding the display region, wherein the border region includes an encapsulation region;
a plurality of display units disposed in the display region;
an encapsulation member disposed in the border region;
a plurality of wires disposed in the border region;
a peripheral metal layer disposed in the encapsulation region; and
a cover substrate arranged opposite to the base substrate, wherein the display units and the wires are disposed between the base substrate and the cover substrate,
the encapsulation member is disposed in the encapsulation region and configured to bond and fix the base substrate to the cover substrate,
the wires at least include a plurality of first type wires and a plurality of second type wires, wherein the plurality of second type wires are disposed fully inside the encapsulation region under the encapsulation member,
the encapsulation member is in direct contact with both the peripheral metal layer and the plurality of second type wires disposed, and
both the peripheral metal layer and the plurality of second type wires disposed fully inside the encapsulation region under the encapsulation member form a frit metal in the encapsulation region.

2. The display panel according to claim 1, wherein:
the plurality of second type wires disposed fully inside the encapsulation region under the encapsulation member are disposed between the cover substrate and the peripheral metal layer; and
the plurality of second type wires disposed fully inside the encapsulation region under the encapsulation member are electrically insulated from the peripheral metal layer.

3. The display panel according to claim 1, wherein:
the wires and the peripheral metal layer are formed by a same conductive layer.

4. The display panel according to claim 1, wherein:
the display unit is an organic light-emitting diode (OLED) display unit or a liquid crystal display (LCD) unit.

5. The display panel according to claim 1, wherein:
the border region further includes a wiring region surrounding the display region;
the encapsulation region surrounds the wiring region; and
the plurality of first type wires are disposed in the wiring region.

6. The display panel according to claim 5, wherein:
the wiring region has a first surface disposed with the plurality of first type wires,
the encapsulation region has a second surface disposed with the plurality of second type wires, and
the first surface after being disposed with the plurality of first type wires exhibits a value of surface roughness different from the second surface after being disposed with the plurality of second type wires.

7. The display panel according to claim 5, wherein:
each second type wire includes a plurality of hollow patterns configured to increase the adhesive force between the base substrate and the encapsulation member.

8. The display panel according to claim 1, wherein:
each second type wire has a width of approximately 5 µm-10 µm, including 5 µm and 10 µm.

9. The display panel according to claim 1, wherein:
the second type wire has a width larger than the first type wire.

10. The display panel according to claim 1, wherein:
the wires include a plurality of scanning lines and a plurality of data lines; and
all the scanning lines and data lines are disposed in the encapsulation region.

11. The display panel according to claim 1, wherein:
the border region further includes a wiring region surrounding the display region;
the encapsulation region surrounds the wiring region; and
the wires include a plurality of signal lines disposed in the encapsulation region and a plurality of scanning lines disposed in the wiring region.

12. The display panel according to claim 1, wherein:
the border region further includes a wiring region surrounding the display region;

the encapsulation region surrounds the wiring region; and
the wires include a plurality of scanning lines disposed in the wiring region and a plurality of data lines disposed in the encapsulation region.

13. The display panel according to claim 1, wherein:
the wires are made of molybdenum or alloys of molybdenum and niobium.

14. The display panel according to claim 1, wherein:
the display panel has a rectangular shape, a circular shape, or an octagonal shape.

15. An electronic device, comprising a display panel, wherein the display panel comprising:
a base substrate including a display region and a border region surrounding the display region, wherein the border region includes an encapsulation region;
a plurality of display units disposed in the display region;
an encapsulation member disposed in the border region;
a plurality of wires disposed in the border region;
a peripheral metal layer disposed in the encapsulation region; and
a cover substrate arranged opposite to the base substrate,
wherein the display units and the wires are disposed between the base substrate and the cover substrate,
the encapsulation member is disposed in the encapsulation region and configured to bond and fix the base substrate to the cover substrate,
the wires at least include a plurality of first type wires and a plurality of second type wires, wherein the plurality of second type wires are disposed fully inside the encapsulation region under the encapsulation member,
the encapsulation member is in direct contact with both the peripheral metal layer and the plurality of second type wires, and
both the peripheral metal layer and the plurality of second type wires disposed fully inside the encapsulation region under the encapsulation member form a frit metal in the encapsulation region.

16. The electronic device according to claim 15, wherein:
the plurality of second type wires disposed fully inside the encapsulation region under the encapsulation member are disposed between the cover substrate and the peripheral metal layer; and
the plurality of second type wires disposed fully inside the encapsulation region under the encapsulation member are electrically insulated from the peripheral metal layer.

17. The electronic device according to claim 15, wherein:
the border region further includes a wiring region surrounding the display region;
the encapsulation region surrounds the wiring region; and
the plurality of first type wires are disposed in the wiring region.

18. The electronic device according to claim 15, wherein:
the wires include a plurality of scanning lines and a plurality of data lines; and
all the scanning lines and data lines are disposed in the encapsulation region.

19. The display panel according to claim 1, wherein:
the display panel has a non-rectangular shape,
wherein the display panel further includes a wiring region and a stepped area, a plurality of connecting terminals of the wires are disposed in the stepped area, and the wiring region is disposed between the encapsulation region and the display region,
wherein the encapsulation region further includes a sub-encapsulation region, the plurality of second type wires are disposed fully inside of the sub-encapsulation region of the encapsulation region, and the remained wires are disposed in the wiring region, and
wherein the wiring region is disposed surrounding the entire display region, and the sub-encapsulation region is disposed only surrounding a portion of the display region.

20. A display panel, comprising:
a base substrate including a display region and a border region surrounding the display region, wherein the border region includes an encapsulation region;
a plurality of display units disposed in the display region;
an encapsulation member disposed in the border region;
a plurality of wires disposed in the border region; and
a cover substrate arranged opposite to the base substrate,
wherein the display units and the wires are disposed between the base substrate and the cover substrate,
the encapsulation member is disposed in the encapsulation region and configured to bond and fix the base substrate to the cover substrate,
the wires at least include a plurality of first type wires and a plurality of second type wires, wherein the plurality of second type wires are disposed fully inside the encapsulation region under the encapsulation member and the plurality of second type wires include at least one data line or at least one scanning line, and
the plurality of second type wires disposed fully inside the encapsulation region under the encapsulation member form a frit metal in the encapsulation region.

* * * * *

UNITED STATES PATENT AND TRADEMARK OFFICE
CERTIFICATE OF CORRECTION

PATENT NO. : 10,224,385 B2
APPLICATION NO. : 15/219176
DATED : March 5, 2019
INVENTOR(S) : Chunyang Li and Dong Qian It is certified that error appears in the above-identified patent and that said Letters Patent is hereby corrected as shown below:

On the Title Page

Item (73) should read:
(73) Assignee: Shanghai Tianma AM-OLED Co., Ltd., Shanghai (CN); Tianma Micro-electronics Co., Ltd., Shenzhen, (CN)

Signed and Sealed this
Thirtieth Day of July, 2019

Andrei Iancu
*Director of the United States Patent and Trademark Office*